United States Patent [19]
Boyko et al.

[11] Patent Number: 5,450,290
[45] Date of Patent: Sep. 12, 1995

[54] PRINTED CIRCUIT BOARD WITH ALIGNED CONNECTIONS AND METHOD OF MAKING SAME

[75] Inventors: Christina M. Boyko, Conklin; Francis J. Bucek, Binghamton; Richard W. Carpenter, Johnson City; Voya R. Markovich, Endwell, all of N.Y.; Darleen Mayo, Knightdale, N.C.; Cindy M. Reidsema, Austin, Tex.; Joseph G. Sabia, Norwich, N.Y.

[73] Assignee: International Business Machines Corporation, Armonk, N.Y.

[21] Appl. No.: 195,532

[22] Filed: Feb. 14, 1994

Related U.S. Application Data

[63] Continuation-in-part of Ser. No. 12,111, Feb. 1, 1993, and Ser. No. 154,341, Nov. 17, 1993.

[51] Int. Cl.[6] .................... H05K 1/14; H05K 3/36; B05D 5/12
[52] U.S. Cl. .................... 361/792; 361/743; 361/795; 361/778; 174/260; 174/261; 174/262; 174/263; 29/830; 427/96; 427/97; 257/698; 257/700
[58] Field of Search ........ 361/792, 739, 743, 760–761, 361/772, 775, 777–779, 790–791, 793, 794, 795; 174/250, 260, 261, 262, 263, 264, 265; 257/698, 700; 427/96–97; 29/830

[56] References Cited

U.S. PATENT DOCUMENTS

| | | |
|---|---|---|
| 3,374,129 | 3/1968 | Boucher . |
| 3,436,819 | 4/1969 | Lunine . |
| 3,601,523 | 8/1971 | Arndt et al. . |
| 3,726,002 | 4/1973 | Greenstein et al. . |
| 4,008,300 | 2/1977 | Ponn . |
| 4,150,421 | 4/1979 | Nishihara et al. . |
| 4,383,363 | 5/1983 | Hayakawa et al. . |
| 4,442,966 | 4/1984 | Jourdain et al. . |
| 4,511,757 | 4/1985 | Ors et al. . |
| 4,572,764 | 2/1986 | Fan . |
| 4,641,425 | 2/1987 | Dubuisson et al. ............ 29/851 |
| 4,642,160 | 2/1987 | Burgess . |
| 4,706,165 | 11/1987 | Takenaka et al. ............ 361/412 |
| 4,935,584 | 6/1990 | Boggs ........................... 174/262 |
| 5,006,673 | 4/1991 | Freyman et al. . |
| 5,025,555 | 6/1991 | Mase . |
| 5,048,166 | 9/1991 | Wakamatsu .................. 29/830 |
| 5,133,120 | 7/1992 | Kawakami et al. . |
| 5,136,471 | 8/1992 | Inasaka ......................... 174/261 |
| 5,281,151 | 1/1994 | Arima et al. ................ 174/255 |
| 5,286,926 | 2/1994 | Kimura et al. ............... 174/250 |

OTHER PUBLICATIONS

IBM Technical Disclosure Bulletin, vol. 30, No. 7, p. 135 (Dec. 1987).

*Primary Examiner*—Bot L. Ledynh
*Attorney, Agent, or Firm*—Calfee, Halter & Griswold

[57] ABSTRACT

The present invention provides an improved circuit board for mounting integrated circuit chips and a technique for manufacturing the circuit board. The board permits direct chip attachment to the circuit board by providing the necessary geometry for the footprint pattern of the chip connections without the necessity of multi-level packaging using chip carriers. The circuit board includes a substrate with plated through holes, and a film of photoresist dielectric material disposed on the substrate. The dielectric material is photo patterned to form vias which are then filled with conductive material. Electrical connection pads are formed on the exposed surface of the film of dielectric material in the pattern of the chip footprint to be mounted thereon. The vias and plated through holes are arranged in groups and patterns which provide some direct connection between the pads and plated through holes, some pads wired to vias on the exposed surface of the film of dielectric material and some vias wired to plated through holes on the surface of the substrate.

22 Claims, 4 Drawing Sheets

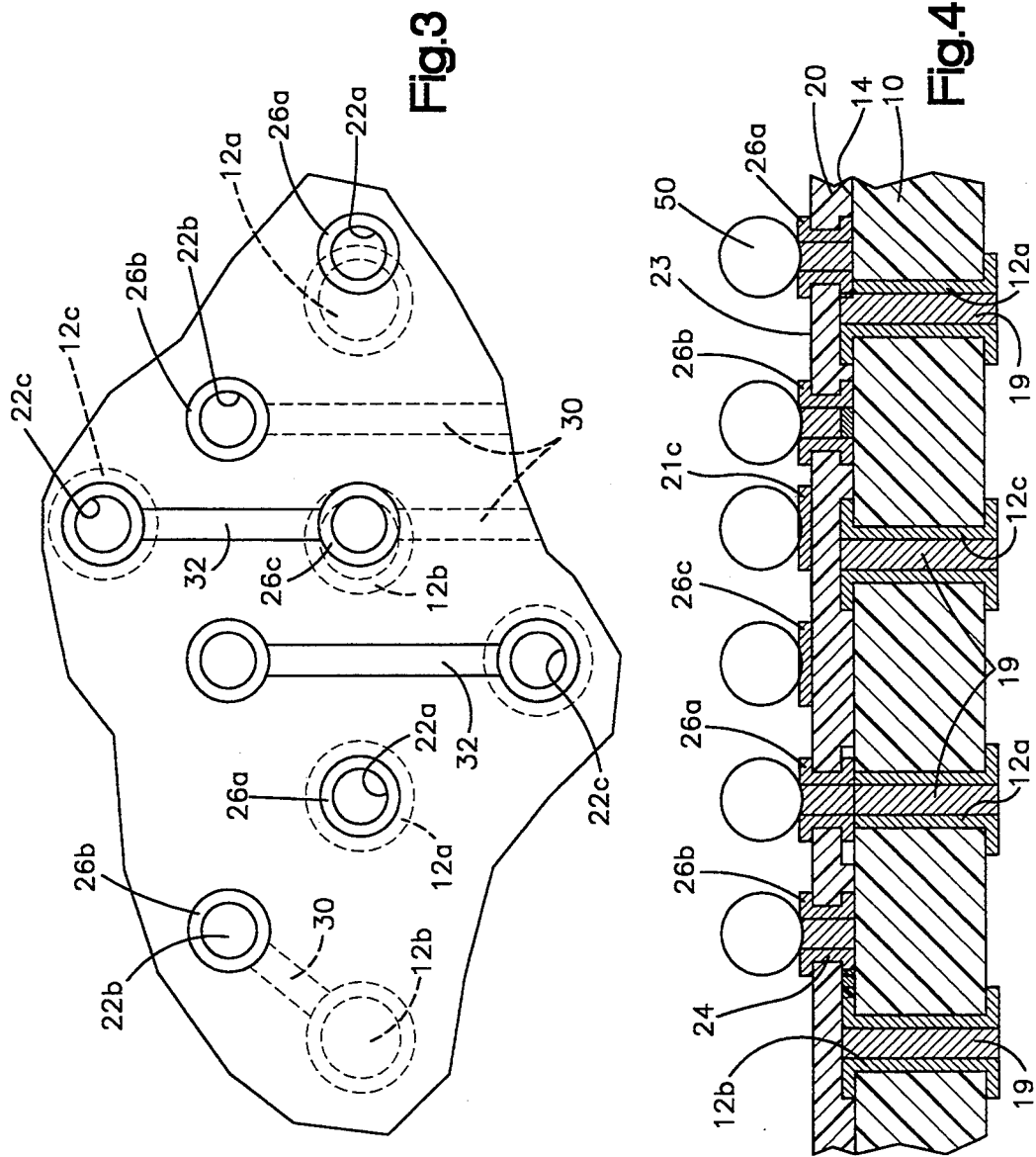

PRINTED CIRCUIT BOARD WITH ALIGNED CONNECTIONS AND METHOD OF MAKING SAME

FIELD OF THE INVENTION

This application is a continuation-in-part of application Ser. No. 08/012,111, filed Feb. 1, 1993, entitled "Printed Circuit Board or Card for Direct Chip Attachment and Fabrication Thereof" (Attorney Docket EN9-92-037) and of application Ser. No. 08/154,341, filed Nov. 17, 1993, entitled "Via Fill Compositions for Direct Attach of Devices and Methods for Applying Same" (Attorney Docket EN9-92-080).

BACKGROUND OF THE INVENTION

This invention relates generally to printed circuit boards and the method of manufacture thereof, and more particularly to a printed circuit board structure for mounting integrated circuit chips which allows a chip having a very high density footprint to be mounted onto a circuit board using direct chip attach techniques (DCA) and providing a high density of I/O signal connections.

In the packaging of semi-conductor chips, it is required that the chips be physically mounted on to some supporting structure which not only supplies physical support for the chips, but also provides for the circuits on or in the chip, but also increasing the number of power, ground, and I/O connections which are necessary electrical connections to provide power, ground plane and, of course, I/O signals. As the technology for manufacturing I/C chips advances, it is possible to provide more and more circuits on a given chip size, thus increasing the density of the required connections. As this number of connections increases, the density of the connectors on the chip for making such connections also increases. At the present state of technology, it is well within the art to provide connectors on the chip that are on a 10-mil grid center-to-center. These chips are conventionally mounted on circuit boards along with other electrical components and indeed other chips, the circuit boards being capable of being utilized in computers or other devices which make use of the chips.

Circuit board technology does not lend itself to providing such fine line geometry as is necessary with such densely packed I/O pads, circuit board technology typically requiring at least 20 mil centers between the plated through holes (PTH) in the circuit board necessary for providing the necessary connections. While theoretically it is possible to provide the much finer plated through hole (PTH) grid on the circuit boards, nevertheless providing such fine geometry would be inordinantly expensive in those instances where it is required only for certain portions of the circuit board, i.e., where the chips are to be mounted.

Prior art solutions to this have utilized the technique of mounting chips on a chip carrier which has the fine line geometry and closely spaced pads necessary to provide connection to the chips, with the carrier providing the necessary fan-out pattern through surface and/or internal wiring and vias for subsequent connection to circuit board typically by pin-in-hole connections. This technique, while somewhat effective, nevertheless introduces a factor of requiring two levels of packaging with the attendant additional steps of processing and attendant additional cost. Thus, it is desirable and is a goal to develop techniques which allow direct chip attach (DCA) to the circuit board without the necessity of two levels of packaging.

SUMMARY OF THE INVENTION

According to the present invention, an improved circuit board for mounting integrated circuit chips and a technique for manufacturing the circuit board is provided. Such a board permits direct chip attachment to the circuit board by providing the necessary geometry for the footprint pattern of the chip connections without the necessity of multi-level packaging using chip carriers.

The circuit board of the present invention comprises a substrate formed of a dielectric material having plated through holes. Preferably, the plated through holes are filled with electrical/thermal conducting material to provide essentially filled holes rather than holes having only an annular plating. A thin film of dielectric material is coated on top of one surface of the substrate material and has an exposed surface which is spaced from the surface of the substrate on which it is coated. The plated through holes in the substrate are arranged in a pre-selected pattern which typically will be on centers of anywhere from 20 to 100 mils, depending upon the technology used in the manufacture of the board and other well known factors. The thin film of dielectric material coated on the circuit board has electrical connection pads formed thereon for the reception of the contacts on an I/C chip preferably by C4 or flip chip bonding. Typically, these pads will be formed in a pattern which is much more dense than the pattern of the plated through holes, these pads typically being on 10-mil centers.

The pads on the surface of the dielectric film are arranged in a first group which are aligned with a first group of vias extending through said dielectric film which first group of vias are in turn aligned with a first group of the plated through holes in the substrate. The vias are filled with conducting materials such as conductive paste, and thus provide a direct electrical connection for a mounting of the contacts of a chip to a plated through hole without the necessity of any fan-out wiring on the surface of either the substrate or the dielectric film. Thus, this first group of vias on the thin film dielectric material has a direct path without any surface wiring from the surface of the film of the dielectric material, through the vias and through plated through holes in the substrate. Hence, this group of contacts requires no fan-out wiring.

The surface of the film of dielectric material is provided with a second group of electrical connection pads which do not directly connect to plated through holes therebelow. Rather, the second group of pads is connected to the top surface of the substrate through a second group of vias having conducting material therein. The pads of this second group are connected by wiring to the second group of vias to connect the second group of vias to a second group of plated through holes. In the preferred embodiment, this second group of vias is connected to the second group of plated through holes utilizing two different patterns of connection. In the first pattern of connection, the pads on surface of the dielectric film of material are aligned with vias therein which go through the film of dielectric material to the surface of the substrate on which conductive wires are formed to connect the vias to corresponding plated through holes. A second pattern of pads are provided on the surface of the dielectric film material which are connected by wiring on the surface of the film of dielectric material to vias extending through the film of dielectric material and in contact with plated through holes which correspond to these vias. It is possible that a third pattern could be provided wherein pads are connected by conductors on the surface of the film of dielectric material to vias going through the film of dielectric material to the surface of the substrate with wiring on the surface of the substrate connecting the vias to the corresponding plated through holes.

It is also preferred that in order to obtain maximum benefit of the present invention, the spacing of the plated through holes in a substrate be in even number multiples of the spacing of the pads on the I/C chip to be connected, i.e., if the spacing of the pads on the I/C chip are on 10-mil centers, then the holes in the substrate should be on centers of, e.g., 20 mils, 30 mils, etc.

By providing a group of vias and connection pads on the thin film layer directly above the plated through holes, direct connection can be effected for this group of pads without the necessity of fan-out wiring on either the substrate or the film of dielectric material. Moreover, by using wiring on both the substrate and the surface of the dielectric material, crossing patterns can be effected between wires so that the most effective use of each of these surfaces can be accomplished while still utilizing the direct connection for a certain group of the pads. This highly efficient use of the surface topography and the technology for various degrees of fineness of processing can provide a relatively lower cost, high density, direct chip attachment technique for mounting I/C chips.

In a typical and preferred embodiment, the I/C chips are attached by C4 techniques, i.e., using flip-chip bonding with solder ball connections of the chip to the pads on the surface of the dielectric film of material. In such cases, since the plated through holes in the substrate are typically large and annular in shape. It is preferred that these holes be filled with a conductive material to prevent the solder from being sucked down into the holes, thereby losing enough solder so that the mechanical or electrical connections may not be satisfactorily formed.

BRIEF DESCRIPTION OF THE DRAWINGS

FIG. 3 is a plan view, somewhat diagrammatic, showing various types of connections pneumatically;

FIG. 4 is a longitudinal section of a somewhat diagrammatic taken substantially along the plane designated by the line 4—4 of FIG. 3.

DESCRIPTION OF THE PREFERRED EMBODIMENT

Figure 1:
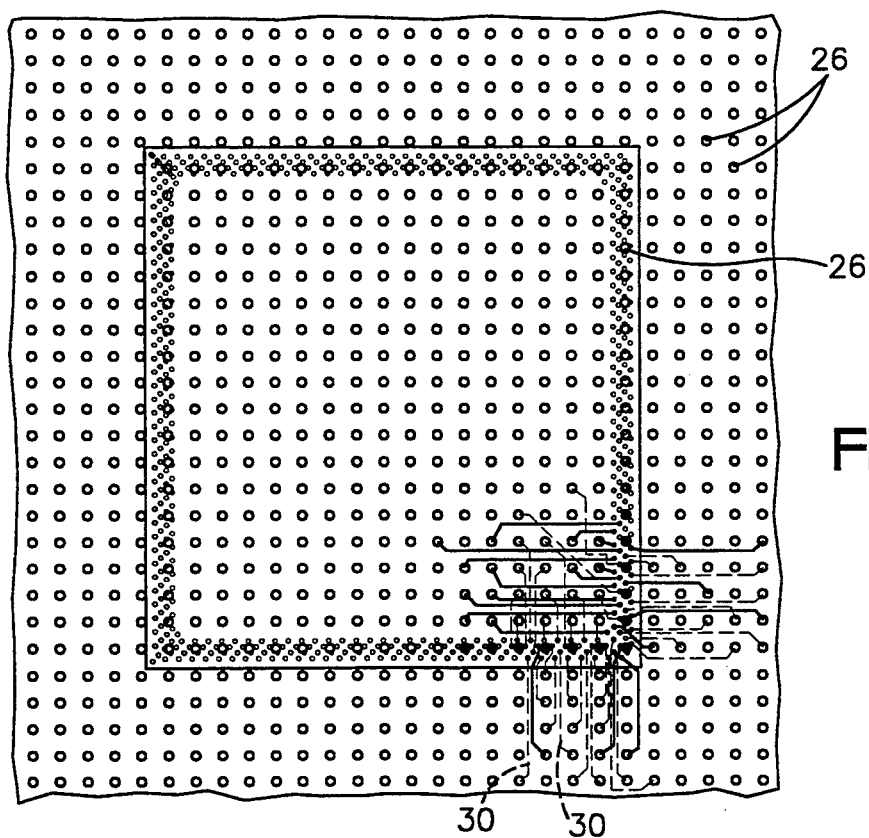
FIG. 1 is a plan view of a portion of a circuit board formed according to this invention showing the chip footprint outline and showing a portion of the wiring.
Figure 2:
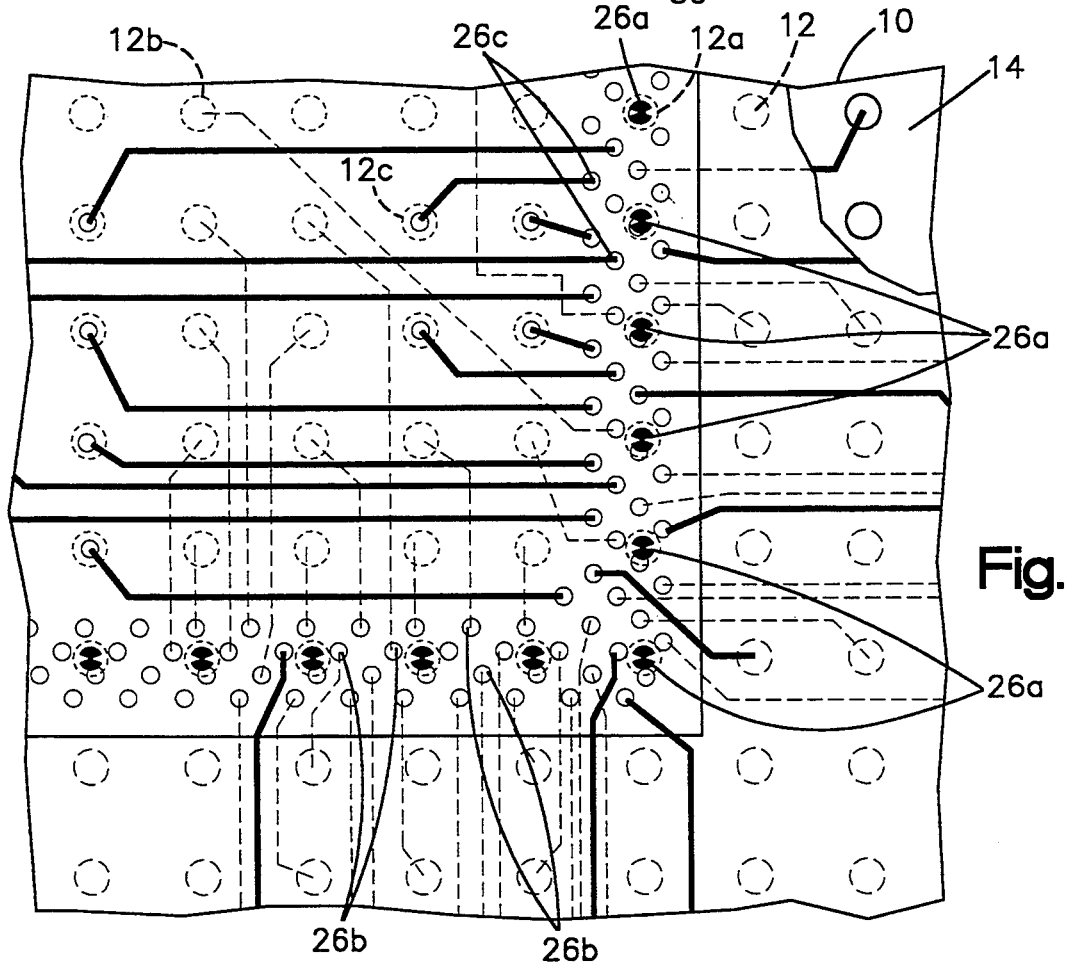
FIG. 2 is a detailed view of a portion of FIG. 1 showing the wiring pattern and other connection pattern in detail.

Referring now to the drawings, a portion of a printed circuit board formed and having a pattern of interconnections according to this invention is shown. It is to be understood that while only a portion of the circuit board is shown, the entire circuit board would contain many other components besides the chip shown here, and indeed could contain several chips mounted according to the present invention as well as other circuit components.

In its final configuration, and as shown in FIGS. 1–4, the circuit board of the present invention includes a substrate 10 made of a dielectric material, which preferably is FR4, a glass-filled epoxy material and which is conventional and well known in the art for forming circuit board substrates. Other materials, such as polyimides and polytetrafluoroethylene can be used for circuit boards. Generally, the circuit board is from 20 to about 100 mils thick, and typically is about 60 mils thick for many applications, which is preferred for the present application. The substrate 10 includes a plurality of through holes 12a, 12b, 12c which run from the upper surface 14 to the lower surface 16 of the substrate 10, which holes are preferably formed by drilling, although other techniques can be employed. The holes are arranged in a particular pattern having certain groupings as will be described presently. Hence, these different groupings are designated by the letter suffixes a, b and c, it being understood that the holes, per se, are identical. This same technique of using letter suffixes is adopted for other parts of the structure which are similarly grouped, but otherwise the same. Hence, these parts of the structure are sometimes referred to collectively without the use of letter suffix designations. The through holes 12 are plated with a conducting material 18, such as electroless copper which forms plated through holes (PTH) in a conventional manner. Preferably, the space within the plated material 18 is filled with an electrically/thermally conducting paste 19 the composition of which will be described presently. Various pads and circuit line connections are provided on top of the surface 18 which will be described presently.

Disposed over the upper surface 14 of the substrate 10 is a thin film of dielectric material 20. Preferably, this material is a photoresist material so that it can be photolithographically processed to provide the necessary vias and circuitry as will be described presently. Preferred photoresist materials include optical photoresist (OPR) filled cyanate resin, or a photoresist formed according to the teachings of U.S. Pat. No. 5,002,624. The dielectric photoresist material 20 conventionally is 2 to 4 mils thick, although other thickness could be used. The dielectric material 20 is provided with a plurality of vias 22 arranged in groups and patterns designated as 22a, 22b, 22c extending from exposed surface 23 thereof to surface 14 of the substrate 20, and which vias 22 are plated with copper 24 and filled with a conductive material 25, such as a conductive paste. The vias are formed by conventional photolithographic techniques. The exposed surface 23 of the film of dielectric material 20 is provided with a plurality of electrical connection pads 26 arranged in groups and patterns designated as 26a, 26b, 26c which groups and patterns are as follows. The pads 26 are formed in an array which correspond in pattern to the footprint of the chip to be attached thereto. In the preferred embodiment, the chip to be attached is to be attached by a flip-chip (or C-4) bonding using solder ball connections. Hence, the pads 26 each correspond in location to an I/O contact on I/C chip 50. The electrical connection pads 26 are arranged and spaced such that they correspond to the footprint of the electrical contacts of the I/C chip 50 that is to be attached to this circuit board. The pads 26 are arranged in two groups. Each of the pads of the first group designated 26a are aligned with one of the first group of vias 22a which in turn are each aligned with one of the first group of plated through holes 12a. (As used herein "aligned" means in close enough proximity to make electrical contact with the conducting material associated therewith.) Thus, for the chip contacts contacting the pads 26a direct electrical connection is established with the plated through holes 12a without any additional wiring on the surface of either the substrate 10 or dielectric film 20. (As used herein direct connection between the elements means a connection without the use of surface wiring.) The remaining connection pads are arranged in a second group having a first pattern 26b and a second pattern 26c. The pads of the first pattern 26b of the second group are aligned with the first pattern 22b of a second group of vias.

The vias of the first pattern 22b extend through the dielectric film and terminate at a location spaced from any of the plated through holes 12. Electrical conductors 30, formed on the upper surface 14 of substrate 10 connect each of the vias of the first pattern 22b to one of the plated through holes of the second pattern of holes 12b.

The pads 26c of the second pattern of the second group are spaced from the vias 22, but are each connected to a second pattern 22c of the vias of the second group by electrical conductors 32 on the exposed surface 23 of the dielectric film of material 20. The second pattern of vias 22b of the second group are aligned with through holes in a second pattern 12c of the second group of holes. (It is also possible to have a third pattern of vias which would be spaced from the connection pads 26 on the surface 23, of the film 20, and also extend through the film 20 to a location spaced from holes 12. Conductors on the surface 23 of the film 20 and also conductors on the surface 14 of the substrate 12 would connect the connection pads to the vias and the vias to the holes respectively.)

It is preferred that the spacing of the connection pads 26 and the holes 12 be in even, i.e., whole number multiples of each other, typically a pattern of the pads being spaced about 10 mils center to center can be achieved with photolithographic techniques, and spacing of 20, 30, 40 or 50 mils for the holes 12 can be achieved by drilling or other mechanical techniques.

With the pattern of connection pads 26, vias 22, and holes 12 according to this invention, a very dense chip footprint can be accommodated utilizing direct chip attach techniques, which allows the substrate manufacturing and circuitization to be much less demanding. Hence, it can be seen that by using this technique a large number of pads on the surface of the dielectric connect the chips directly through vias to the PTHs in the substrate, thus eliminating the need for any surface wiring whatsoever. Other pads connect directly to vias which have wiring on the surface of the substrate connecting them to the PTHs. Thus, there is wiring only on one surface. Other pads are connected by surface wiring and the dielectric material to vias, which vias connect directly to PTHs, again requiring wiring on only one surface. Moreover, wiring on different surfaces can "cross", thus making wiring easy, with short runs possible.

Figure 5:
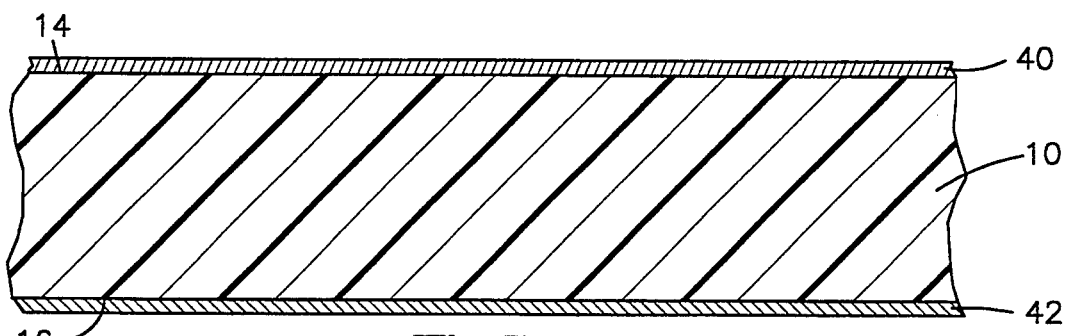
FIGS. 5-12 depict, somewhat diagrammatically, the steps in forming a circuit board, and mounting chips thereon, according to this invention.

The exact technique for forming a printed circuit board and chip mounting according to the present invention may vary to some extent depending upon the demands of the wiring size. If line widths of 3.0 to 5.0 mils are needed, a preferred process is to provide a subtractive type etching circuitization on the substrate as shown in FIGS. 5-11. Referring now to FIG. 5, a substrate 10 is provided which is formed of FR4, which as indicated previously is a glass-filled epoxy material well known in the art, or a polyimide or polytetrafluoroethylene material. Substrate 10 has $\frac{1}{2}$-ounce copper sheets 40 and 42 on opposite surfaces 14 and 16 of the substrate 10. The copper 40 is what will be circuitized and become the conducting material 18 after circuitization. The substrate also typically will have internal planes of conducting material and provide ground, power and signal input/output (I/O). These are omitted in FIGS. 5-11 for clarity of illustration but are shown somewhat diagrammatically in FIG. 12.

Figure 6:
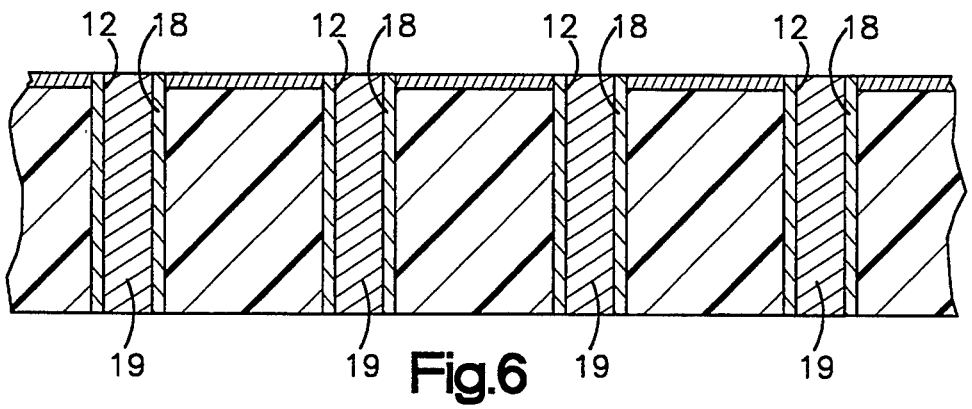

The through holes 12 are drilled through the substrate 10 and copper sheets 40 and 42. The holes 12 are then plated with the conducting material 18, preferably copper, and preferably by conventional electro or electroless plating techniques. The plated holes are then filled with paste 19 which is preferably conducting paste using conventional techniques or the techniques described in co-pending application Ser. No. 08/154,341, filed Nov. 17, 1993, entitled "Via Fill Compositions for Direct Attach of Devices and Methods for Applying Same" (Attorney Docket No. EN9-92-080), which is incorporated herein by reference. This structure is shown in FIG. 6. The paste is either a conventional paste or the paste disclosed in said copending application. For example, paste 19 in the novolac epoxy embodiment comprises about 20.18 parts by weight of an epoxy novolac designated 8212 manufactured by Ciba-Geigy and containing about 30% methyl ethyl ketone; about 55.4 parts by weight of copper powder from Alcan Powers and Pigments; 0.18 parts by weight of a surface treating agent, specifically, a silane coupling agent Z-6040 from Dow-Corning and about 0.045 parts by weight 2-ethyl-4-ethyl imidazole.

The paste 19 is applied using conventional techniques or the techniques as disclosed in said copending application, such as the sacrificial carrier technique or the injection technique.

Figure 7:
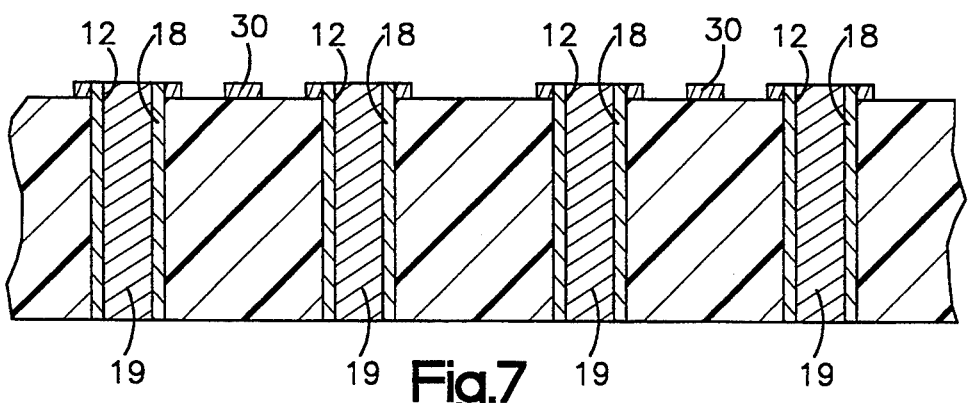

Following the supplying of the paste 19, the copper plating 40 is circuitized as shown in FIG. 7 using conventional photoresist and photolithographic techniques, including subtractive etching of the involved copper to provide the necessary conductors 30 on the surface 14 of the substrate 10 to connect with the vias which are to be formed subsequently in the dielectric material.

Figure 8:
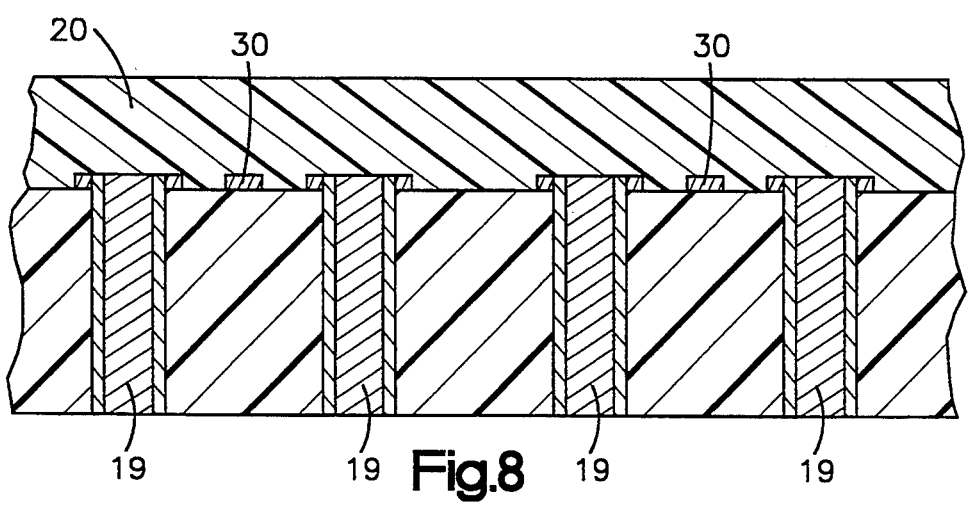
Figure 9:
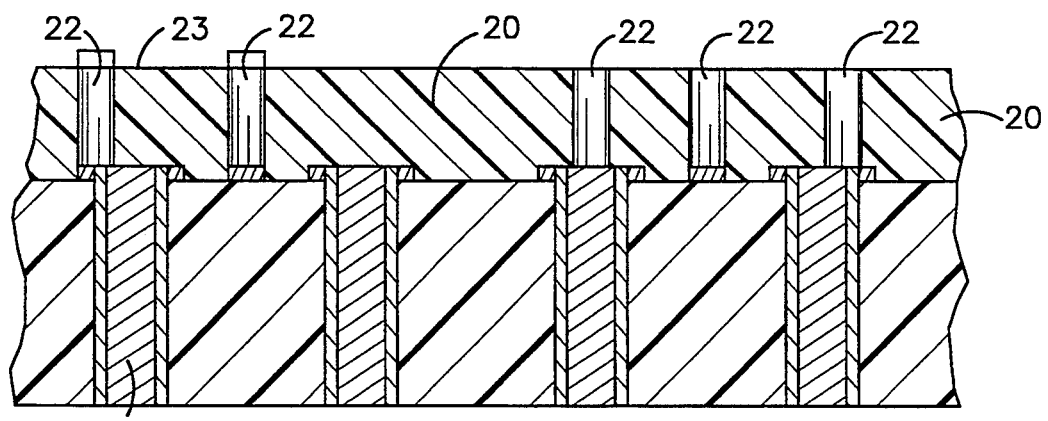
Figure 10:
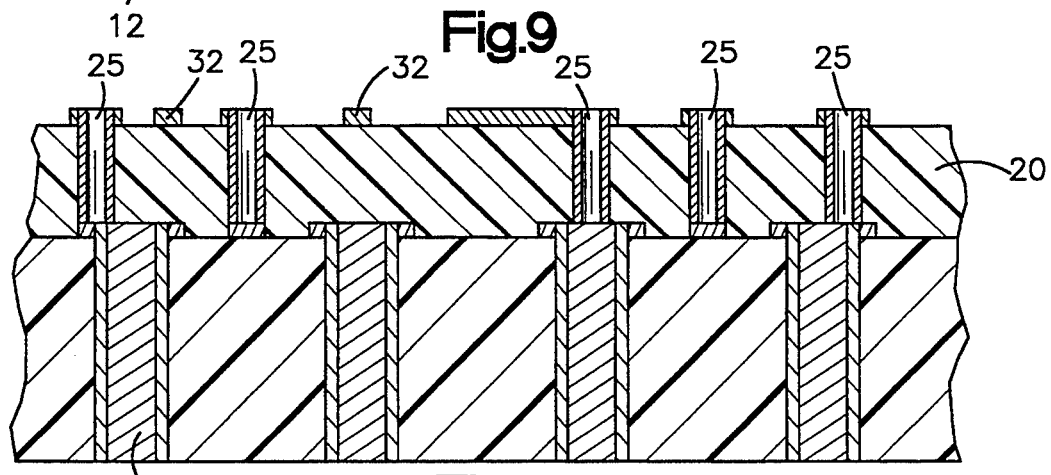
Figure 11:
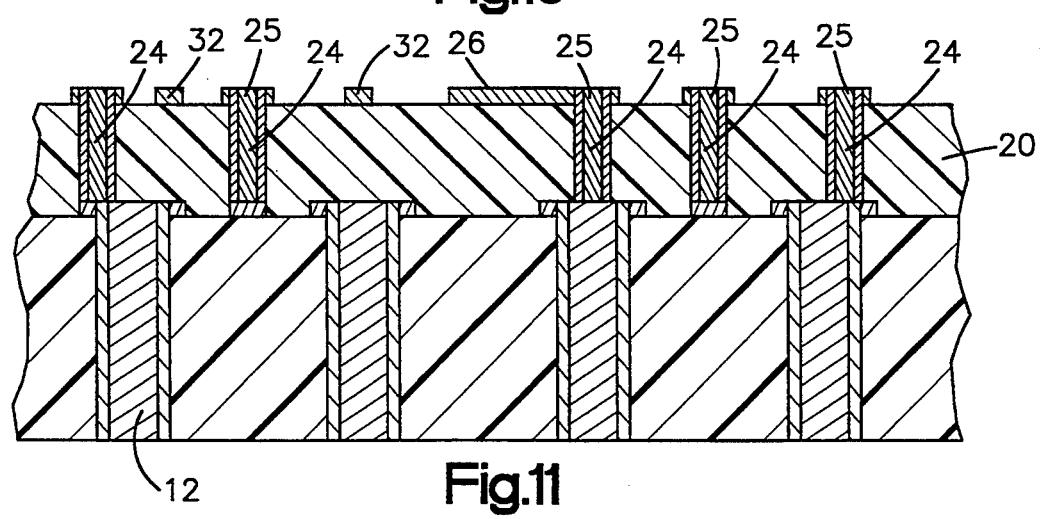

Following the circuitization of the copper layer 40, the film of dielectric material 20 is applied over the circuitized surface 14 as shown in FIG. 8. Preferably, this dielectric material 20 is a photosensitive material such as optical photoresist (OPR). The photosensitive material is optically exposed and developed to provide the necessary via pattern 22 for connection to the holes 12 and conductors 30 on the upper surface 14 of the substrate 10 as shown in FIG. 9.

Following this, the surface 23 of the dielectric 20 is circuitized to form the necessary conductors 32 by a conventional processes using photoresist techniques. This can be done by subtraction etching, similar to that as described with respect to the substrate 10, or an additive plating process can be used. This additive process includes applying a photoresist over dielectric layer 20, patterning and developing the photoresist, seeding (including the vias 22), stripping the photoresist, and additive plating thus forming the structure shown in FIG.

10, including the connection pads 26, the circuitry 32 and the copper plating 24 in the vias 22. The plated vias are then filled with conductive paste 25 of the types previously described in the manner as previously described to form the structure shown in FIG. 11.

The patterns of the connection pads 26, the conductors 30 and 32, the vias 22 and the holes 12 are located as previously described so as to provide the desired geometric configuration which includes connection pads 26a aligned with vias 22a, which are aligned with holes 12a for direct connection; as well as connection pads 26b aligned with vias 22b, connected to holes 12b; and connection pads 26c connected to vias 22c which connect to holes 12c.

It is to be understood that other processing techniques can be used to form the patterns of the present invention. For example, depending on line size, additive plating could be used to form the circuitry or conductors 30 on the upper surface 12 of the substrate 10.

Figure 12:
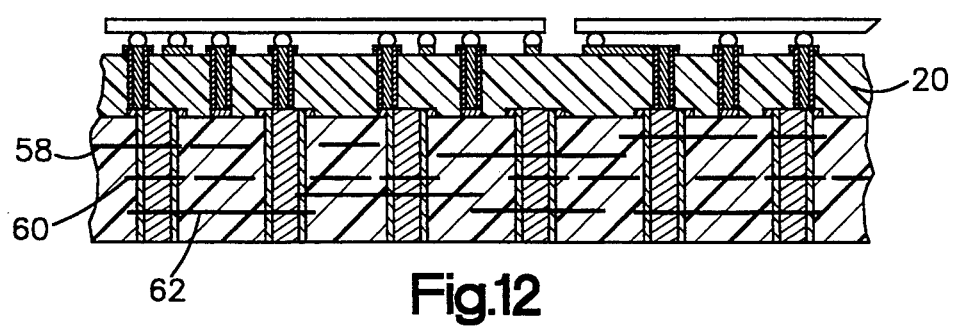

FIG. 12 shows the final circuit board configuration having a pair of semiconductor I/C chips 54 mounted thereon, utilizing solder connection 56, or what is commonly known as C-4 connections. FIG. 12 also shows, diagrammatically, ground planes 58, signal planes 60 and power planes 62. These planes are present, but where omitted from FIGS. 5–11 for clarity of illustration.

Although one embodiment of this invention has been shown and described, various adaptations and modifications can be made without department from the scope of the invention as defined in the appended claims.

What is claimed is:

1. A printed circuit board for the reception of at least one integrated circuit chip mounted thereon, and wherein each integrated circuit chip has a plurality of electrical contacts arranged in a footprint, comprising a dielectric substrate having a plurality of holes extending from a first surface on said substrate through to a second opposite surface, said holes having electrically conducting material disposed therein and including material exposed to the first surface;
  a dielectric film of material disposed on said first surface of said substrate and having an exposed surface thereon spaced from said first surface of said substrate;
  a plurality of vias extending through said dielectric film from said exposed surface thereof to the first surface of the substrate with said vias having electrical conducting material disposed therein,
  a plurality of electrical connection pads disposed on said exposed surface of said dielectric film of material arranged in the footprint of the electrical contacts on each of said integrated circuit chips; said electrical connection pads being arranged to have;
    A) a first group of electrical connection pads contacting a first group of said vias which are aligned with a corresponding first group of said holes in said substrate to thereby provide direct electrical connection of said first group of pads with said first group of holes; and
    B) a second group of electrical connection pads;
  said second group of connection pads contacting a second group of vias;
  electrical conductors connecting said second group of connection pads through said second group of vias to a second group of holes in said substrate.

2. The structure as defined in claim 1 wherein a pattern of said plurality of said second group of vias are connected to a pattern of said second group of electrical connection pads by wiring on the exposed surface of said film of dielectric material.

3. The structure as defined in claim 1 wherein a pattern of said plurality of said second group of vias are connected to a pattern of said second group of electrical connection pads by wiring on said first surface of said substrate material.

4. The structure of claim 3 wherein said pattern of said second group of electrical connection pads are directly connected to said pattern of said second group of vias.

5. The structure as defined in claim 1 wherein
  a first pattern of said plurality of said second group of vias are connected to a first pattern of said second group of electrical connection pads by wiring on the exposed surface of said film of dielectric material; and
  a second pattern of said plurality of said second group of vias are connected to a second pattern with said second group of electrical connection pads by wiring on said first surface of said substrate.

6. The structure as defined in claim 1 wherein the spacing between the holes is an even multiple of the spacing between the vias.

7. The structure as defined in claim 1 wherein conductive paste is disposed in said holes.

8. The structure as defined in claim 1 wherein the conductive paste is disposed in said vias.

9. The structure as defined in claim 1 wherein said film of dielectric material is a photoresist.

10. The structure as defined in claim 1 wherein said substrate is an organic dielectric material.

11. The structure as defined in claim 1 wherein a semiconductor chip is mounted on said electrical connection pads.

12. A method of forming printed circuit board for the reception of at least one integrated circuit chip mounted thereon, and wherein each integrated circuit chip has a plurality of electrical contacts arranged in a footprint, comprising the steps of:
  providing a dielectric substrate having a first surface and a second opposite surface, forming a plurality of holes extending from said first surface to said second surface, depositing electrically conducting material in said holes and including said conducting material being exposed to the first surface;
  forming a dielectric film of material on said first surface of said substrate and having an exposed surface thereon spaced from said first surface of said substrate;
  forming a plurality of vias extending through said dielectric film from said exposed surface thereof to the first surface of the substrate, depositing electrically conducting material in said vias,
  forming a plurality of electrical connection pads on said exposed surface of said dielectric film of material arranged in the footprint of the electrical contacts on each of said integrated circuit chips; said electrical connection pads and said vias and said holes being arranged to have;
    A) a first group of electrical connection pads contacting a first group of said vias which are aligned with a corresponding first group of said holes in said substrate to thereby provide direct electrical connection of said first group of pads with said first group of holes; and B) a second group of electrical connection pads; said second group of connection pads contacting a second group of vias;

electrical conductors connecting said second group of connection pads through said second group of vias to a second group of holes in said substrate.

13. The method as defined in claim 12 wherein a pattern of said plurality of said second group of vias are connected to a pattern of said second group of electrical connection pads by forming wiring on the exposed surface of said film of dielectric material.

14. The method as defined in claim 12 wherein a pattern of said plurality of said second group of vias are connected to a pattern of said second group of electrical connection pads by forming wiring on said first surface of said substrate material.

15. The method of claim 14 wherein said pattern of said second group of electrical connection pads are directly connected to said pattern of said second group of vias.

16. The method as defined in claim 12 wherein a first pattern of said plurality of said second group of vias are connected to a first pattern of said second group of electrical connection pads by forming wiring on the exposed surface of said film of dielectric material; and a second pattern of said plurality of said second group of vias are connected to a second pattern with said second group of electrical connection pads by forming wiring on said first surface of said substrate.

17. The method as defined in claim 12 wherein the holes are formed with a spacing therebetween which is an even multiple of the spacing between the vias.

18. The method as defined in claim 12 wherein conductive paste is disposed in said holes.

19. The method as defined in claim 12 wherein the conductive paste is disposed in said vias.

20. The method as defined in claim 12 wherein said film of dielectric material is a photoresist.

21. The method as defined in claim 12 wherein said substrate is an organic dielectric material.

22. The method as defined in claim 12, further characterized by mounting a semiconductor chip on said electrical connection pads.

* * * * *